United States Patent
Ikeda

(10) Patent No.: US 9,601,688 B2
(45) Date of Patent: Mar. 21, 2017

(54) METHOD OF MANUFACTURING MAGNETORESISTIVE ELEMENT AND METHOD OF PROCESSING MAGNETORESISTIVE FILM

(71) Applicant: CANON ANELVA CORPORATION, Kawasaki-shi (JP)

(72) Inventor: Masayoshi Ikeda, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 14/185,116

(22) Filed: Feb. 20, 2014

(65) Prior Publication Data
US 2014/0170778 A1 Jun. 19, 2014

Related U.S. Application Data

(63) Continuation of application No. PCT/JP2012/005286, filed on Aug. 23, 2012.

(30) Foreign Application Priority Data

Aug. 25, 2011 (JP) .................. 2011-183231

(51) Int. Cl.
H01L 21/00 (2006.01)
H01L 43/12 (2006.01)
H01J 37/32 (2006.01)

(52) U.S. Cl.
CPC ........ *H01L 43/12* (2013.01); *H01J 37/32357* (2013.01)

(58) Field of Classification Search
CPC .... H01J 37/32357; H01L 43/12; H01L 43/08; H01L 27/222; H01F 41/308;
(Continued)

(56) References Cited

U.S. PATENT DOCUMENTS 6,572,917 B2 6/2003 Narisawa et al.
7,060,194 B2 6/2006 Kodaira et al.
(Continued)

FOREIGN PATENT DOCUMENTS

JP 2003-31772 A 1/2003
JP 2003-174215 A 6/2003
(Continued)

OTHER PUBLICATIONS

International Search Report issued in PCT/JP2012/005286, dated Nov. 27, 2012 (2 pages).
(Continued)

*Primary Examiner* — Charles Garber
*Assistant Examiner* — Abdulfattah Mustapha
(74) *Attorney, Agent, or Firm* — Fitzpatrick, Cella, Harper & Scinto

(57) ABSTRACT

In a case where reactive ion etching using a gas containing an oxygen atom is used for etching or a magnetoresistive element, a magnetic film becomes damaged due to oxidation. Such damage to the element by the oxidation becomes a factor which causes deterioration in element properties. In the etching of the magnetoresistive element according to one embodiment of the present invention, a magnetoresistive film is subjected to ion beam etching and thereafter to reactive ion etching. A side deposition formed by the ion beam etching coats a sidewall of the magnetoresistive film and reduces damage by the oxygen atom during the later reactive ion etching. Also, a time during which the element is exposed to plasma of the gas containing the oxygen atom can be reduced.

12 Claims, 4 Drawing Sheets

(58) Field of Classification Search
CPC ..... H01F 10/3254; B82Y 40/00; B82Y 10/00; B82Y 25/00
USPC .......................... 257/421, E21.001, E29.323
See application file for complete search history.

(56) References Cited

U.S. PATENT DOCUMENTS

| | | | |
|---|---|---|---|
| RE40,951 E | | 11/2009 | Kodaira et al. |
| 7,919,826 B2 | | 4/2011 | Iwayama et al. |
| 2003/0026894 A1 | | 2/2003 | Narisawa et al. |
| 2005/0016957 A1 | | 1/2005 | Kodaira et al. |
| 2008/0265347 A1 | | 10/2008 | Iwayama et al. |
| 2009/0314740 A1 | * | 12/2009 | Ikemoto et al. ................ 216/22 |
| 2009/0316292 A1 | * | 12/2009 | Iwasaki .................. B82Y 10/00 360/75 |
| 2014/0138347 A1 | | 5/2014 | Toyosato et al. |

FOREIGN PATENT DOCUMENTS

| | | | |
|---|---|---|---|
| JP | 2005-42143 A | | 2/2005 |
| JP | 2005-268349 A | | 9/2005 |
| JP | 2008-294420 A | | 12/2008 |
| JP | 2009238261 A | * | 10/2009 |

OTHER PUBLICATIONS

International Preliminary Report on Patentability issued in PCT/JP2012/005286, dated Aug. 20, 2013 (3 pages).

\* cited by examiner

METHOD OF MANUFACTURING MAGNETORESISTIVE ELEMENT AND METHOD OF PROCESSING MAGNETORESISTIVE FILM

CROSS-REFERENCES TO RELATED APPLICATIONS

This application is a continuation application of International Application No. PCT/JP2012/005286, filed Aug. 23, 2012, which claims the benefit of Japanese Patent Application No. 2011-183231, filed Aug. 25, 2011. The contents of the aforementioned applications are incorporated herein by reference in their entireties.

TECHNICAL FIELD

The present invention relates to a method of manufacturing a magnetoresistive element and a method of processing a magnetoresistive film.

BACKGROUND ART

MRAM (Magnetic Random Access Memory) is nonvolatile memory utilizing a magnetoresistive effect such as a TMR (Tunneling Magneto Resistive) effect, and is watched by all the world with keen interest as epoch-making next-generation memory having integrating density comparable to that of DRAM (Dynamic Random Access Memory) and high-speed characteristics comparable to those of SRAM (Static Random Access Memory), and capable of unlimitedly rewriting data.

A configuration of the MRAM is formed for example of and underlayer, a magnetoresistive film as a basic structure of a magnetoresistive element, and a cap layer, which are formed in sequence on a silicon or glass substrate having metal wiring (or a word line). As an example of the magnetoresistive film, an antiferromagnetic layer, a magnetization pinned layer, an insulating layer, and a magnetization free layer are stacked one on top of another in sequence from the underside.

The magnetoresistive element is placed for example at a point of intersection between a word line and a bit line for use in reading and writing of signals. The magnetoresistive element is used as a memory cell in which an underlayer of a lowermost layer and a cap layer of an uppermost layer of the magnetoresistive element are processed into a lower electrode and an upper electrode, respectively, which are then connected to wiring, thereby serving as electrodes.

The magnetoresistive element is configured such that reading or writing of data is performed by exchanging information with the metal wiring by changing an electrical resistance value of a current passing through the insulating layer to "0" or "1" by freely changing a direction of magnetization of the magnetization free layer by perpendicularly passing a current through the magnetoresistive element from the lower electrode to the upper electrode.

Etching technique is generally used to process the magnetoresistive element. The Etching technique includes IBE (Ion Beam Etching) method and RIE (Reactive Ion Etching) method.

It is known that, in the reactive ion etching method in particular, a metal film of the magnetoresistive element can be selectively etched by using a mixed gas of hydrocarbon said oxygen as an etching gas. (Refer to Patent Document 1.)

CITATION LIST

Patent Document

Patent Document 1: Japanese Patent Application Laid-Open No. 2005-268349

SUMMARY OF INVENTION

With the above-mentioned etching method, however, a problem arises as given below; specifically, the metal film included in the magnetoresistive element (particularly, a sidewall of the magnetoresistive film in process of being treated) is oxidized in the process by an oxygen atom contained in the etching gas. This oxidation of the metal film causes deterioration in element properties. When the metal film is oxidized, an effective region of the magnetoresistive film becomes smaller than a designed value (or an intended region). In other words, a region which does not function as the magnetoresistive film is formed in a sidewall portion of the magnetoresistive film after etching, and the affective region of the magnetoresistive film becomes correspondingly smaller. Then, this problem may become more remarkable as the element becomes finer.

Meanwhile, the IBE method does not oxidize the element because of performing processing with an ion beam using an inert gas. However, the IBE method requires that a thicker mask layer is deposited because of a low selective ratio between a mask portion and a transition metal portion. When the mask layer becomes too thick, it is difficult to achieve a desired processing shape. Also, the IBE method is prone to deposition of an etched film on the sidewall of the element, and this deposit causes a short and loses a function of the element.

The present invention has been made in view of the above-mentioned problems. An object of the present invention is to provide a method of manufacturing a magnetoresistive element and a method of processing a magnetoresistive film, capable of reducing deterioration in element properties due to oxidation as compared to the conventional processing of a magnetoresistive element by reactive ion etching, and achieving a good shape after processing, as compared to the conventional processing of the magnetoresistive element by ion beam etching.

In order to solve the foregoing problems, according to a first aspect of the present invention, there is provided a method of manufacturing a magnetoresistive element, including: removing a portion of the magnetoresistive film having a hard mask formed thereon, in a thickness direction of the magnetoresistive film, by ion beam etching; and removing the magnetoresistive film having the hard mask formed thereon by reactive ion etching by using a gas containing a carbon atom, a hydrogen atom and an oxygen atom.

Also, according to a second aspect of the present invention, there is provided a method of processing a magnetoresistive film, including: removing a portion of the magnetoresistive film having a hard mask formed thereon, in a thickness direction of the magnetoresistive film, by ion beam etching; and removing the magnetoresistive film having the hard mask formed thereon by reactive ion etching by using a gas containing a carbon atom, a hydrogen at oat and an oxygen atom.

According to the present invention, it is possible to provide a method of manufacturing a magnetoresistive element and a method of processing a magnetoresistive film, capable of reducing deterioration in element properties due to oxidation as compared to conventional processing of a magnetoresistive element by reactive ion etching, and achieving a good shape after processing, as compared to the conventional processing of the magnetoresistive element by ion beam etching.

DESCRIPTION OF EMBODIMENTS

Figure 1:
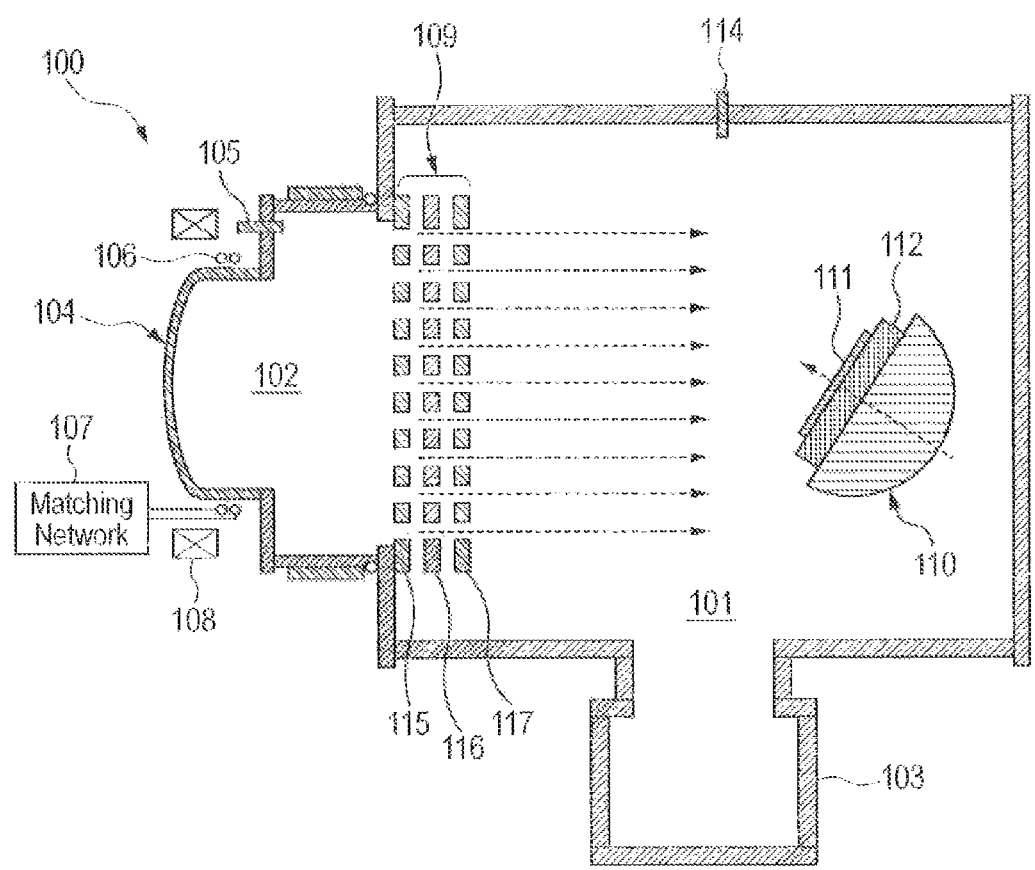
FIG. 1 is a view for assistance in explaining a manufacturing apparatus (or an ion beam etching apparatus) for a magnetoresistive element according to one embodiment of the present invention.

Although embodiments of the present invention will be described with reference to the drawings, it is to be understood that the present invention is not limited to the embodiments, and changes could be made hereto as appropriate without departing from the spirit and scope of the invention. Incidentally, in the drawings to be described below, portions having the same function are indicated by the reference numerals, and repeated description of some of the same portions will be omitted.

FIG. 1 illustrates a schematic view of an ion beam etching apparatus. An ion beam etching apparatus 100 includes a process chamber 101 and a plasma generation chamber 102. A vacuum pump 103 is installed in the process chamber 101. A bell jar 104, a first gas introduction unit 105, an RF antenna 106, a matching network 107, and an electromagnetic coil 108 are installed in the plasma generation chamber 102, and a grid 109 is installed on a boundary between the process chamber 101 and the plasma generation chamber 102.

A substrate holder 110 is provided in the process chamber 101, and a substrate 111 is mounted on an ESC electrode 112. Plasma of an etching gas is generated in the plasma generation chamber 102 by introducing the etching gas from the first gas introduction unit 105, and applying a radio frequency to the RF antenna 106. Then, the substrate 111 is processed by applying a DC voltage to the grid 109, drawing out ions in the plasma generation chamber 102 as a beam, and irradiating the substrate 111 with the beam. A charge-up of the ion beam drawn out is prevented by electrically neutralizing the ion beam by a neutralizer (unillustrated), and irradiating the substrate 111 with the ion beam. Also, the process chamber 101 is provided with a second gas introduction unit 114, and a process gas can be introduced. The substrate holder 110 can be inclined at any given angle with respect to the ion beam. Also, the substrate holder 110 has a structure such that the substrate 111 can rotate (or revolve) in its in-plane direction.

Figure 3:
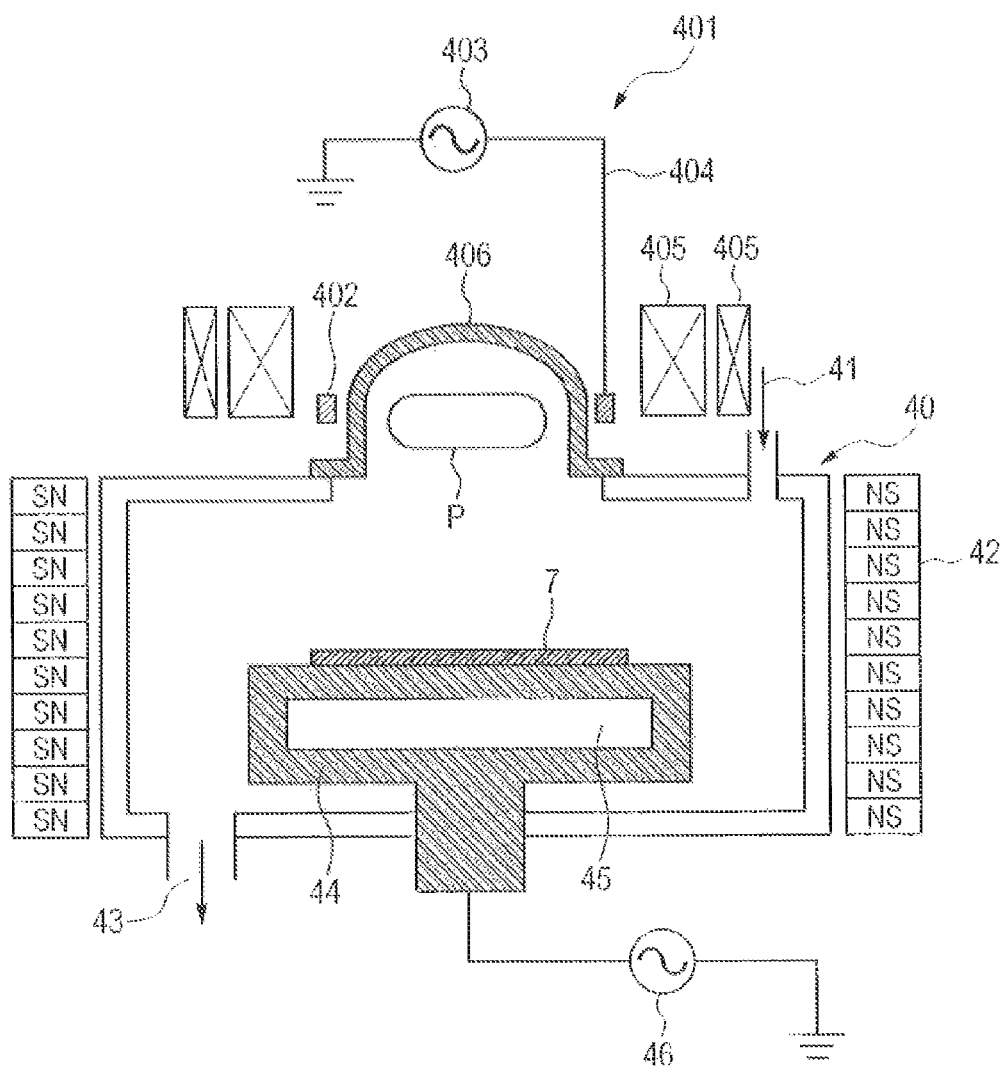
FIG. 3 is a view for assistance in explaining a manufacturing apparatus (or a reactive ion etching apparatus) for a magnetoresistive element according to one embodiment of the present invention.

FIG. 3 is a view for assistance in explaining an example of a reactive ion etching apparatus preferred for the embodiment. The apparatus of FIG. 3 can use reactive ion etching method to process a magnetoresistive element. The etching apparatus includes a vacuum container 40, and a dielectric call container 406 air-tightly connected to the vacuum container 40 in such a manner that its internal space communicates with the vacuum container 40. The inside of the vacuum container 40 is evacuated by an evacuation system 43. Also, a substrate is transported through a gate valve (unillustrated) into the vacuum container 40, and is held on a substrate holder 44. The substrate holder 44 can be maintained at a predetermined temperature by a temperature control mechanism 45.

Many sidewall magnets 42 are arranged side by side on the outside of a sidewall of the vacuum container 40 thereby to form a cusp magnetic field along an inner surface of the sidewall of the vacuum container 40. The cusp magnetic field prevents the plasma from diffusing onto the inner surface of the sidewall of the vacuum container 40.

Next, description will be given with regard to operation during etching execution. First, a gas instruction system 41 is operated to introduce a predetermined flow rate of etching gas from a cylinder storing the gas through piping, a valve and a flow rate regulator into the vacuum container 40. The introduced etching gas diffuses into the dielectric wall container 406 via the inside of the vacuum container 40. Then, a plasma source 401 is operated. The plasma source 401 includes an antenna 402 which generates an induction field in the dielectric wall container 406, a cover supply 403 connected to the antenna 402 via a matching network (unillustrated) by a transmission path 404, and an electromagnet 405. The electromagnet 405 generates a predetermined magnetic field in the dielectric wall container 406. The power supply 403 generates high-frequency power (or source power) to be supplied to the antenna 402. A current passes through the antenna 402 by a high frequency generated by the high-frequency power supply 403 for plasma, thereby to form plasma P in the dielectric wall container 406.

The formed plasma P diffuses from the dielectric wall container 406 into the vacuum, container 40 and reaches the vicinity of the surface of the substrate 7 thereby to etch the surface of the substrate 7. At the same time, a bias power supply 46 is operated to apply a self-bias voltage as a negative DC voltage to the substrate 7 and thereby control ion entry energy front the plasma to the surface of the substrate 7.

Next, description will be given with reference to FIG. 2 with regard to a method of manufacturing a magnetoresistive element according to the embodiment using the above-mentioned apparatus illustrated in FIGS. 1 and 3.

Figure 2A:
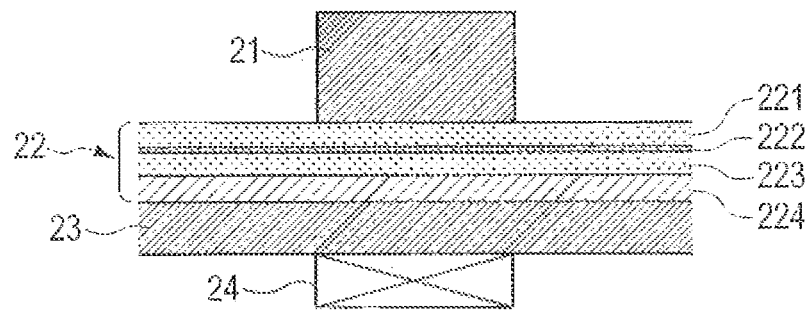
FIG. 2A is a view for assistance in explaining part of a manufacturing process for the magnetoresistive element according to one embodiment of the present invention.

As illustrated in FIG. 2A, as an example of a stacked structure of the magnetoresistive element according to the embodiment, wiring 24 (for example, copper (Cu)) is formed on a silicon, glass or the like substrate, and an underlayer 23 as a lower electrode to be joined to the wiring 24 is formed on the wiring 24. A magnetoresistive film 22 as a basic structure of the magnetoresistive element is formed on the under layer 23. A cap layer 21 (hereinafter, sometimes called a hard mask) which serves as an upper electrode and functions as the hard mask during etching is formed on the magnetoresistive film 22. Various layers may be inserted between the magnetoresistive film 22 and the cap layer 21 according to characteristics of the magnetoresistive element. The cap layer 21 of FIG. 2A is illustrated as being in a state after having been subjected to patterning using a photoresist or the like.

An electroconductive material is used for the underlayer 23 since the underlayer 23 is processed into the lower electrode by a later process. For example, a single-layer or multilayer film including tantalum, titanium, aluminum, silicon, ruthenium, or an electroconductive compound of these, specifically, tantalum nitride, titanium nitride, ruthenium oxide, ruthenium nitride, tantalum carbide, titanium carbide, or the like may be used.

The magnetoresistive film 22 is formed for example of an antiferromagnetic layer 224, a magnetization pinned layer 223, a barrier layer 222, and a magnetization free layer 221, which are stacked one on top of another in sequence from the underside. As examples of materials for the layers, PtMn is used for the antiferromagnetic layer 224, CoFeB/Ru/CoFeB formed of a stacked structure of CoFeB as a ferromagnetic layer and Ru as a nonmagnetic layer is used for the magnetization pinned layer 223, MgO is used for the barrier layer 222, and CoFeB is used for the magnetization free layer 221.

In the embodiment, it is preferable that the cap layer 21 be made of a material capable of achieving selectivity for the magnetoresistive film 22 during etching, since the cap layer 21 functions as the hard mask for the etching of the magnetoresistive film 22. For example, a single-layer or multilayer film including tantalum, titanium, or an electroconductive compound of these, specifically, tantalum nitride, titanium nitride, tantalum carbide, titanium carbide, or the like is preferable.

In the present invention, etching is performed by IBE method, starting first from a state illustrated in FIG. 2A. The cap layer 21 functions as the hard mask, and thus, a pattern of cap layer 21 is transferred to the magnetoresistive film 22. Generally, in the IBE method, an etched film is deposited in large amounts on a sidewall, and the etched material is re-deposited on the sidewall of the magnetoresistive film 22.

At this time, little deposit on the sidewall is removed as mentioned above, and thus, as illustrated in FIG. 2B, the film etched by the IBE method is deposited on the sidewall of the element. This deposit on the sidewall will be hereinafter called a side deposition 30.

Figure 2B:
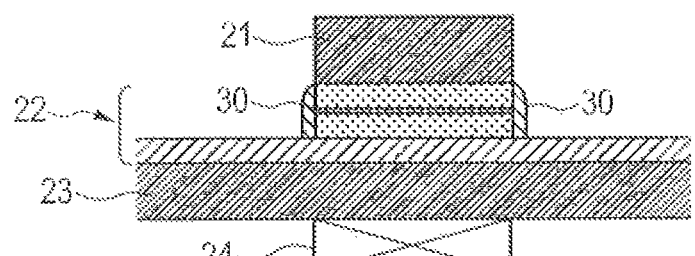
FIG. 2B is a view for assistance in explaining part of the manufacturing process for the magnetoresistive element according to one embodiment of the present invention.
Figure 2C:
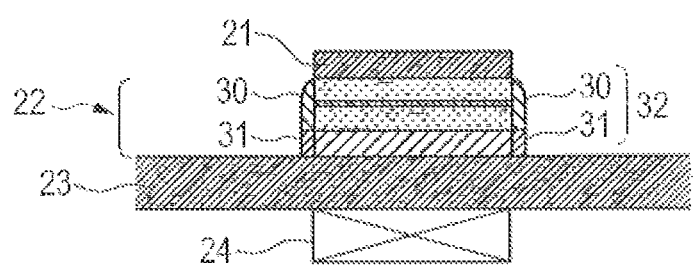
FIG. 2C is a view for assistance in explaining part of the manufacturing process for the magnetoresistive element according to one embodiment of the present invention.

The magnetoresistive film 22 is partially etched by the IBE method as illustrated in FIGS. 2A and 2B, and thereafter, the remaining processing is performed by RIE method thereby to form a state illustrated in FIG. 2C. In other words, the present invention obtains the magnetoresistive element by etching the magnetoresistive film 22 by a combination of two methods, i.e., the IBE method and the RIE method.

First, a state illustrated in FIG. 2B is obtained by the IBE method etching the magnetoresistive film 22 to a point before the lower electrode layer 23 is reached, or equivalently, etching the magnetoresistive film 22 halfway. At this time, the material sputter-etched during the etching by the IBE method is deposited on the sidewall of the magnetoresistive film 22. The deposited side deposition 30 functions as a protective film to reduce chemical damage to the magnetoresistive film 22 from an oxygen atom, when the next RIE method etches the magnetoresistive film 22 with a gas containing the oxygen atom. In other words, the etching by the IBE method according to the embodiment forms the protective film for etching by the later RIE method, as well as etching away the magnetoresistive film 22.

At the time of the etching by the IBE method, when an angle of entry is set to 0 degree in a case where the ion beam enters from a direction perpendicular to the substrate (or a film thickness direction of the magnetoresistive film), the protective film is easily formed on the sidewall of the magnetoresistive film, provided that the angle generally lies between 0 and 15 degrees with respect to the substrate.

Then, the magnetoresistive film 22 not removed by the IBE method is removed by the RIE method using a gas containing a carbon atom, a hydrogen atom and an oxygen atom, such as a mixed gas of hydrocarbon and oxygen or an alcohol gas, as an etching gas, thereby to form a state illustrated in FIG. 2C. As mentioned above, at the time of start of the etching by the RIE method, the sidewall of the magnetoresistive film 22 is coated with the side deposition 30, and thus, the magnetoresistive film 22 is not exposed directly to the plasma, which in turn can suppress deterioration in magnetic properties of the magnetoresistive film 22 by the oxygen atom or the like contained in the etching gas. In short, the side deposition 30 in itself as the deposit formed by the IBE method protects the sidewall of the magnetoresistive film 22. Further, the etching by the RIE method proceeds along the side deposition 30, and thus, as a result, a residual layer 31 having a thickness comparable to that of the side deposition 30 is formed. Therefore, the side deposition 30 and the residual layer 31 are combined together to function as a protective film 32 for the sidewall of the magnetoresistive film 22 in process of undergoing the RIE method.

Also, the magnetoresistive film 22 is partially removed by the previous etching by the IBE method, and thus, a time during which the magnetoresistive film 22 undergoes chemical damage is reduced when the magnetoresistive film 22 is processed to a desired etching dimension. Thus, the deterioration in the magnetic properties of the magnetoresistive film 22 is suppressed as compared to a case where the RIE method alone is used to etch the magnetoresistive film 22.

Therefore as in the case of the embodiment, the IBE method is used to etch the magnetoresistive film 22 partially in its thickness direction, and the RIE method is used to etch the magneto resistive film 22 in its remaining portion in the thickness direction, and thereby, the sidewall of the magnetoresistive film 22 can be protected and a time for the etching by the RIE method can be reduced, and thus, damage by oxidation can be greatly reduced. At this time, damage to the magnetoresistive film 22 in the RIE method can be further reduced by maximizing the amount of the magnetoresistive film 22 etched by the IBE method.

Heretofore, problems have arisen as given, below; specifically, the use of the IBE method alone for etching requires a thick mask layer, and also, the side deposition is formed and a short occurs in the side deposition, while the use of the RIE method alone for etching oxidizes the sidewall of the magnetoresistive film 22 and thus forms a region which does not function as the magnetoresistive element. Meanwhile, in the embodiment, the problems are both solved by switching the etching method from the IBE method to the RIE method halfway in the magnetoresistive film 22.

In the embodiment, the protective film 32 is formed outside a region intended for the magnetoresistive element, and thus, a decrease in the effective region of the magnetoresistive element does not occur even after the etching by the RIE method. Also, the side deposition 30 and the residual layer 31 contained in the protective film 32 are oxidized during the etching by the RIE method using the gas containing oxygen, and thus, the occurrence of a short in the protective film 32 is reduced.

Also, a material such as Ta is used for the lower electrode layer 23, and thus, the magnetoresistive film 22 can be etched at a high selective ratio of the magnetoresistive film 22 to the lower electrode layer.

After the lower electrode layer 23 has been exposed by the RIE method removing the magnetoresistive film 22, the protective film 32 may be left or removed. The conventional RIE method has a problem as given below; specifically, the magnetoresistive film in itself is oxidized, and thus, the removal of a damaged portion causes a decrease in the effective region of the magnetoresistive element. On the other hand, the embodiment has an advantage as given below; specifically, the protective film 32 is formed outside the region intended for the magnetoresistive element, and thus, even the removal does not cause a decrease in the effective region of the magnetoresistive element.

Figure 2D:
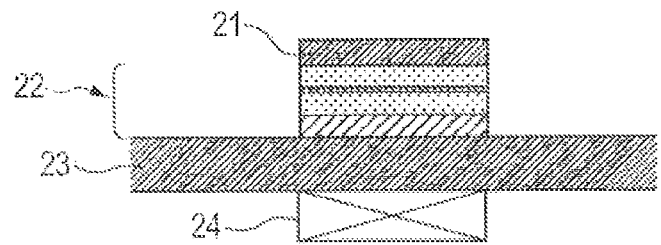
FIG. 2D is a view for assistance in explaining part of the manufacturing process for the magnetoresistive element according to one embodiment of the present invention.

In a case where the side deposition 30 is removed, the side deposition 30 can be removed and oxidized by overetching thereby to form a state illustrated in FIG. 2D. This enables adjusting a pattern shape of the magnetoresistive element, thus preventing a short caused by the side deposition 30.

In the present invention, further, detection or emission spectrum detection of an element is performed during the above-mentioned ion beam etching of the magnetoresistive film 22, and, when a predefined amount of a predetermined element is detected, the etching method is switched from the IBE method to the RIE method, and thereby, a greater effect is achieved. Adoption of such a configuration enables enhancing uniformity in processing between substrates. For the detection of the element, a detector such as SIMS can be installed in the process chamber. Also, for the emission spectrum detection, a detector such as an emission spectroscope can be installed in the process chamber. In a case where the detection is performed, in the RIE method, switching from the IBE method to the RIE method is performed when atoms of a layer on a stopper layer are detected, and thereby, a time during which the magnetic layer is exposed to oxygen plasma can be reduced, and good process reproducibility can be maintained. In the magnetoresistive element of what is called a bottom pin type as illustrated in FIGS. 2A to 2D in particular, the ion beam etching of the magnetoresistive film 22 is performed on the magnetisation free layer 221, the barrier layer 222, and the magnetization pinned layer 223, and switching between the IBE method and the RIE method is performed at the time when the antiferromagnetic layer 224 is reached, and thereby, a greater effect is achieved. The reason is that The antiferromagnetic layer 224 has a greater film thickness as compared to other layers, and thus, the antiferromagnetic layer 224 is easier to detect as compared to other layers, and whether switching from the IBE method to the RIE method is performed is easily determined.

Figure 4:
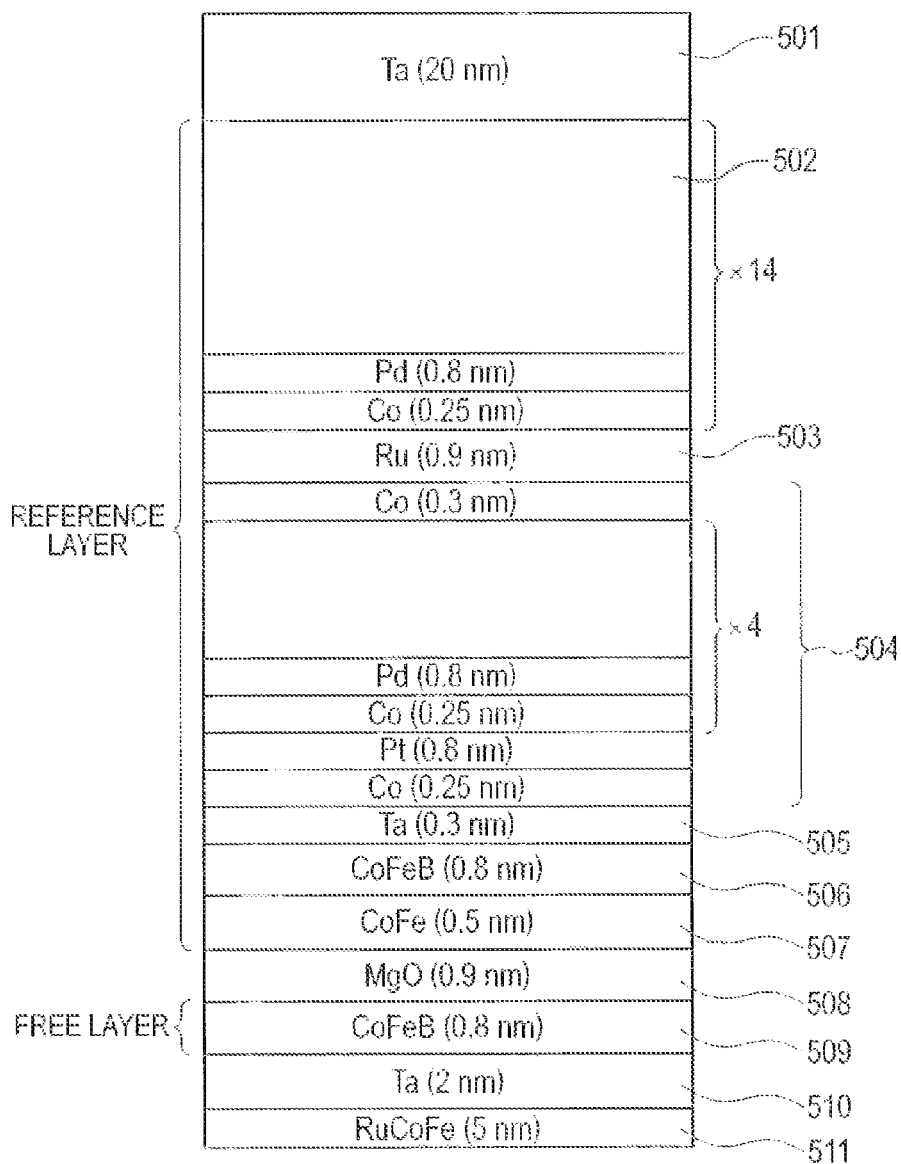
FIG. 4 is a view for assistance in explaining the magnetoresistive element according to one embodiment of the present invention.

Another embodiment of the present invention may also be used to process a perpendicular type magnetoresistive film as illustrated for example in FIG. 4. FIG. 4 is a schematic view of a top pin type in which a magnetization pinned layer is located in an upper portion of a multilayer film, illustrating a stacked structure of a perpendicular magnetization type element (hereinafter, a p-MTJ element). Buffer layers 511, 510 are deposited on the substrate.

CoFeB, for example, is deposited as a free layer 509 on the buffer layer 510, and a barrier layer 508 is formed on the free layer 509. Preferably, the barrier layer is made of magnesium oxide (MgO) in order to achieve a high MR ratio. Besides, the barrier layer may be made of an oxide containing at least one or two or more of magnesium (Mg), aluminum (Al), titanium (Ti), zinc (Zn), hafnium (Hf), germanium (Ge), and silicon (Si).

A fourth reference layer 507 made of CoFe or the like and having a thickness on the order of 0.2 to 1 nm, a third reference layer 506 made of CoFeE or the like, and an orientation separation layer 505 made of Ta or the like are deposited on the barrier layer 508. Then, a second reference layer 504 which imparts perpendicular magnetic anisotropy to the third reference layer 506 and the fourth reference layer 507 is deposited. A stacked structure such for example as Co/Pd, Co/Pt or Co/Ni, or a combination of the stacked structure and Co is used for the second reference layer 504. In this embodiment, a structure in which four sets of Co/Pd are stacked on Co/Pt and further Co is deposited is used for the second reference layer 504.

A nonmagnetic interlayer 503 made of Ru, Cr, Rh, Ir, Re or the like, and a first reference layer 502 constructed of a stacked structure such as Co/Pd, Co/Pt or Co/Ni or a structure of a combination of these are formed on the second reference layer 504. In this embodiment, a structure in which 14 sets of Co/Pd are stacked is deposited is used for the first reference layer 502.

Ta is formed as a cap layer 501 on the first reference layer 502.

Also in such processing of the perpendicular type magnetoresistive film, switching from the IBE method to the RIE method is performed halfway in the magnetoresistive film, and thereby, the protective film is formed on the sidewall of the magnetoresistive film in process of being processed, and oxidation of the magnetic film can be suppressed.

The invention claimed is:

1. A method of manufacturing a magnetoresistive element including a magnetoresistive film, comprising:
   removing a portion of the magnetoresistive film having a hard mask formed thereon, in a thickness direction of the magnetoresistive film, by ion beam etching, and at the same time forming a protective film by depositing a substance removed from the magnetoresistive film by the ion beam etching on a sidewall of the magnetoresistive film having the hard mask formed thereon; and
   in a state where the protective film protects the sidewall, removing the magnetoresistive film having the hard mask formed thereon by reactive ion etching by using a gas containing a carbon atom, a hydrogen atom, and an oxygen atom.

2. The method of manufacturing the magnetoresistive element according to claim 1, wherein, in the ion beam etching, an ion beam is incident on the magnetoresistive film at an angle of 0 to 15 degrees with respect to the thickness direction of the magnetoresistive film.

3. The method of manufacturing the magnetoresistive element according to claim 1,
   wherein the magnetoresistive film includes a magnetization free layer, a barrier layer, a magnetization pinned layer, and an antiferromagnetic layer, which are provided in sequence from a side of the hard mask,
   wherein the magnetization free layer, the barrier layer, and the magnetization pinned layer are removed by the ion beam etching, and
   wherein the antiferromagnetic layer is removed by the reactive ion etching.

4. The method of manufacturing the magnetoresistive element according to claim 3, comprising:
   detecting a time at which the ion beam etching reaches the antiferromagnetic layer; and switching an etching process from the ion beam etching to the reactive ion etching, when the time at which the antiferromagnetic layer is reached is detected.

5. The method of manufacturing the magnetoresistive element according to claim 1, wherein the gas contains at least any one of an alcohol gas and a mixed gas of hydrocarbon and oxygen.

6. The method of manufacturing the magnetoresistive element according to claim 1, wherein one of detection of an element and emission spectrum detection of an element is performed during the ion beam etching.

7. A method of processing a magnetoresistive film, comprising:
removing a portion of the magnetoresistive film having a hard mask formed thereon, in a thickness direction of the magnetoresistive film, by ion beam etching, and at the same time forming a protective film by depositing a substance removed from the magnetoresistive film by the ion beam etching on a sidewall of the magnetoresistive film having the hard mask formed thereon; and
in a state where the protective film protects the sidewall, removing the magnetoresistive film having the hard mask formed thereon by reactive ion etching by using a gas containing a carbon atom, a hydrogen atom, and an oxygen atom.

8. The method of processing the magnetoresistive film according to claim 7, wherein, in the ion beam etching, an ion beam is incident on the magnetoresistive film at an angle of 0 to 15 degrees with respect to the thickness direction of the magnetoresistive film.

9. The method of processing the magnetoresistive film according to claim 7,
wherein the magnetoresistive film includes a magnetization free layer, a barrier layer, a magnetization pinned layer, and an antiferromagnetic layer, which are provided in sequence from a side of the hard mask,
wherein the magnetization free layer, the barrier layer, and the magnetization pinned layer are removed by the ion beam etching, and
wherein the antiferromagnetic layer is removed by the reactive ion etching.

10. The method of processing the magnetoresistive film according to claim 9, comprising:
detecting a time at which the ion beam etching reaches the antiferromagnetic layer; and
switching an etching process from the ion beam etching to the reactive ion etching, when the time at which the antiferromagnetic layer is reached is detected.

11. The method of processing the magnetoresistive film according to claim 7, wherein the gas contains at least any one of an alcohol gas and a mixed gas of hydrocarbon and oxygen.

12. The method of processing the magnetoresistive film according to claim 7, wherein one of detection of an element and emission spectrum detection of an element is performed during the ion beam etching.

* * * * *